United States Patent
Obu et al.

(10) Patent No.: US 9,425,040 B2
(45) Date of Patent: Aug. 23, 2016

(54) METHOD OF FORMING LAMINATED FILM AND FORMING APPARATUS THEREOF

(71) Applicant: TOKYO ELECTRON LIMITED, Tokyo (JP)

(72) Inventors: Tomoyuki Obu, Nirasaki (JP); Masaki Kurokawa, Nirasaki (JP); Hiroki Iriuda, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 46 days.

(21) Appl. No.: 14/029,366

(22) Filed: Sep. 17, 2013

(65) Prior Publication Data

US 2014/0080315 A1 Mar. 20, 2014

(30) Foreign Application Priority Data

Sep. 19, 2012 (JP) ................................. 2012-205788

(51) Int. Cl.
| | |
|---|---|
| *H01L 21/02* | (2006.01) |
| *C23C 16/30* | (2006.01) |
| *C23C 16/40* | (2006.01) |
| *C23C 16/455* | (2006.01) |
| *H01L 21/311* | (2006.01) |

(52) U.S. Cl.
CPC ............ *H01L 21/022* (2013.01); *C23C 16/308* (2013.01); *C23C 16/401* (2013.01); *C23C 16/45523* (2013.01); *C23C 16/45557* (2013.01); *H01L 21/0217* (2013.01); *H01L 21/02164* (2013.01); *H01L 21/02211* (2013.01); *H01L 21/02271* (2013.01); *H01L 21/31111* (2013.01)

(58) Field of Classification Search
CPC .................. H01L 21/02126; H01L 21/02164; H01L 21/02271; C23C 16/30
See application file for complete search history.

(56) References Cited

U.S. PATENT DOCUMENTS

| | | | |
|---|---|---|---|
| 7,261,283 B1 * | 8/2007 | Ohnari ......................... 261/79.2 |
| 2010/0105192 A1 * | 4/2010 | Akae .................. C23C 16/45525 |
| | | | 438/478 |
| 2013/0017685 A1 * | 1/2013 | Akae et al. ..................... 438/703 |
| 2013/0072027 A1 * | 3/2013 | Ota ..................... H01L 21/0214 |
| | | | 438/762 |

FOREIGN PATENT DOCUMENTS

| | | |
|---|---|---|
| JP | 2003-197786 A | 7/2003 |
| JP | 2005-197639 A | 7/2005 |
| JP | 2005-197686 A | 7/2005 |
| JP | 2006-54432 A | 2/2006 |
| JP | 2009-49372 A | 3/2009 |
| JP | 2009-117843 A | 5/2009 |
| JP | 2010-10497 A | 1/2010 |
| KR | 10-2006-0032923 A | 4/2006 |
| KR | 10-0990012 B1 | 10/2010 |
| WO | WO 2011111498 A1 * | 9/2011 ..................... 438/791 |

* cited by examiner

*Primary Examiner* — Kimberly Rizkallah
*Assistant Examiner* — Mounir Amer
(74) *Attorney, Agent, or Firm* — Nath, Goldberg & Meyer; Jerald L. Meyer

(57) ABSTRACT

A method of forming a laminated film includes forming a silicon oxide film on a plurality of target objects loaded in a reaction chamber, and forming a silicon oxynitride film on the plurality of target objects by supplying a silicon source, an oxidizing agent and a nitride agent to the reaction chamber, wherein forming the silicon oxide film and forming the silicon oxynitride film are repeatedly performed for a predetermined number of times on the plurality of target objects to form a laminated film including the silicon oxynitride film and the silicon oxide film.

11 Claims, 5 Drawing Sheets

METHOD OF FORMING LAMINATED FILM AND FORMING APPARATUS THEREOF

CROSS-REFERENCE TO RELATED APPLICATION

This application claims the benefit of Japanese Patent Application Nos. 2012-205788, filed on Sep. 19, 2012 in the Japan Patent Office, the disclosure of which is incorporated herein in its entirety by reference.

TECHNICAL FIELD

The present disclosure relates to a method of forming a laminated film and a forming apparatus thereof.

BACKGROUND

Recently, laminated multi-layer type semiconductor devices have been suggested, in which a laminated film of, e.g., silicon nitride film/silicon oxide film ($SiN/SiO_2$) is formed by alternately arranging an inter-layer insulation film and a sacrificial film, due to a demand for high integration of the semiconductor apparatuses.

However, since the aforementioned laminated film normally has a highly laminated structure, e.g., 48 layers or more, the film thickness thereof becomes too thick, e.g., several micrometers (μm). Further, the laminated film is subject to a crack, i.e., easily broken when the thickness of the laminated film becomes greater, because the SiN film forming the laminated film has a high tensile stress with respect to the semiconductor substrate (Si). As a result, a laminated film that can prevent the occurrence of a crack has been required.

SUMMARY

The present disclosure provides a method of forming a laminated film and a forming apparatus thereof, which can prevent occurrence of crack.

The method of forming a laminated film includes forming a silicon oxide film on a plurality of target objects loaded in a reaction chamber, and forming a silicon oxynitride film on the plurality of target objects by supplying a silicon source, an oxidizing agent and a nitride agent to the reaction chamber, wherein forming the silicon oxide film and forming the silicon oxynitride film are repeatedly performed for a predetermined number of times on the plurality of target objects to form a laminated film including the silicon oxynitride film and the silicon oxide film.

The forming apparatus of forming a laminated film includes a silicon oxide film formation gas supply unit configured to supply a gas for forming a silicon oxide film into a reaction chamber accommodating therein a plurality of target objects, a silicon oxynitride film formation gas supply unit configured to supply a silicon source, a nitride agent and an oxidizing agent into the reaction chamber, and a controller configured to control the silicon oxide film formation gas supply unit and the silicon oxynitride film formation gas supply unit, wherein the controller repeats a silicon oxide film formation process of forming a silicon oxide film on the plurality of target objects by supplying the gas for forming the silicon oxide film into the reaction chamber by controlling the silicon oxide film formation gas supply unit, and a silicon oxynitride film formation process of forming a silicon oxynitride film on the plurality of target objects by supplying the silicon source, the nitride agent, and the oxidizing agent by controlling the silicon oxynitride film formation gas supply unit, so as to form the laminated film of the silicon oxide film and the silicon oxynitride film on the plurality of target

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, a method of forming a laminated film and a forming apparatus thereof in accordance with the present disclosure will be described. The method of forming the laminated film and the forming apparatus of the present disclosure are a method and apparatus for forming a laminated film (SiON/SiO) of a silicon oxynitride film and a silicon oxide film. In this embodiment, a description will be made for a case where a batch type vertical heat treatment apparatus is used as the forming apparatus for forming the laminated film.

Figure 1:
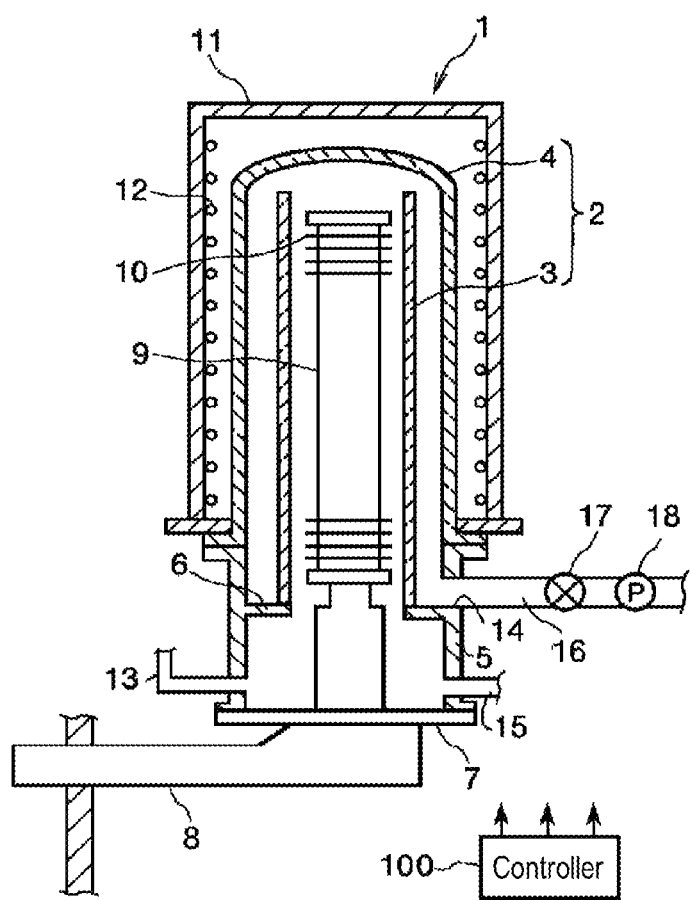
FIG. 1 shows a heat treatment apparatus in accordance with an embodiment of the present disclosure.

As shown in FIG. 1, the heat treatment apparatus 1 is provided with a reaction tube 2 of a substantially cylindrical shape with its longitudinal direction corresponding to a vertical direction. The reaction tube 2 has an inner tube 3 and an outer tube 4 with a ceiling formed to cover the inner tube 3 while maintaining a predetermined space with the inner tube 3. The inner and outer tubes 3 and 4 are formed of a material having high heat-resistant and corrosion-resistant properties, e.g., quartz.

A manifold 5 in a cylindrical shape made of stainless steel (SUS) is arranged below the outer tube 4. The manifold 5 is air-tightly in contact with a lower end of the outer tube 4. Further, the inner tube 3 is supported by a support ring 6, which protrudes from an inner surface of the manifold 5 and forms an one-piece body with the manifold 5.

Arranged below the manifold 5 is a lid body 7 movable in an up and down direction by a boat elevator 8. When the lid body 7 is raised up by the boat elevator 8, a lower end (a furnace opening) of the manifold 5 is closed, whereas when the lid body 7 is lowered by the boat elevator 8, the lower end (the furnace opening) of the manifold 5 is opened.

A wafer boat 9 made of, e.g., quartz, is placed on the lid body 7. The wafer boat 9 is configured to receive a plurality of processing target objects, e.g., semiconductor wafers 10, which are arranged with a predetermined space therebetween in vertical direction.

A heat insulation member 11 is provided around the reaction tube 2 to surround the reaction tube 2. A heater 12 for raising a temperature implemented with, e.g., a resistance-heating element, is provided on a surface of an inner wall of the heat insulation member 11. The heater 12 heats the reaction tube 2 to raise the internal temperature of the reaction tube 2 to a predetermined temperature and, as a result, the semiconductor wafer 10 is heated to a predetermined temperature.

A plurality of processing gas introduction tube 13 extends through the lateral portion of the manifold 5. Meanwhile, FIG. 1 shows only one processing gas introduction tube 13. The processing gas introduction tube 13 is arranged to face an inside space of the inner tube 3. For example, as shown in FIG. 1, the processing gas introduction tube 13 extends through a lateral portion of the manifold 5 at a position lower than the support ring 6.

The processing gas introduction tube 13 is connected to a processing gas supply source (not shown) via a mass flow controller or the like (not shown). In this case, a desired flow rate of the processing gas is supplied to the inside of the reaction tube 2 from the processing gas supply source through the processing gas introduction tube 13. The processing gas supplied via the processing gas introduction tube 13 includes, e.g., a film forming gas for forming a laminated film, a hydrogen gas for forming an atmosphere of hydrogen ($H_2$) within the reaction tube 2 during the film forming process, a hydrogen gas and an oxygen gas for forming an atmosphere of hydrogen ($H_2$) and oxygen ($O_2$) within the reaction tube 2 after the film forming process. In case of silicon oxynitride film (SiON) forming the laminated film, dichlorosilane (DCS) as silicon source, ammonia ($NH_3$) as nitride agent and nitrous oxide ($N_2O$) as oxidizing agent may be used as the film forming gas. In case of silicon oxide film (SiO) forming the laminated film, dichlorosilane (DCS) as silicon source and nitrous oxide ($N_2O$) as oxidizing agent may be used.

An exhaust port 14 is formed through the lateral portion of the manifold 5 to exhaust the gas within the reaction tube 2. The exhaust port 14 is formed at a position higher than the support ring 6 to communicate with a space formed between the inner tube 3 and the outer tube 4 of the reaction tube 2. Therefore, an exhaust gas or the like generated in the inner tube 3 is discharged to the exhaust port 14 via the space between the inner tube 3 and the outer tube 4.

A purge gas supply tube 15 extends through a lateral portion of the manifold 5 below the exhaust port 14. The purge gas supply tube 15 is connected to a purge gas supply source (not shown) through which a desired flow rate of a purge gas, e.g., nitrogen gas is supplied to the reaction tube 2 from the purge gas supply source (not shown).

An exhaust pipe 16 is air-tightly connected to the exhaust port 14. The exhaust pipe 16 is provided with, at its upstream, a valve 17 and a vacuum pump 18. The valve 17 adjusts an opening degree of the exhaust pipe 16 to control pressure within the reaction tube 2 to a predetermined extent. The vacuum pump 18 serves to exhaust the gas within the reaction tube 2 via the exhaust pipe 16 while concurrently controlling the pressure within the reaction tube 2.

Further, the exhaust pipe 16 is configured to have a trap, a scrubber or the like (not shown) provided therein, so that the exhaust gas discharged from the reaction tube 2 is de-toxified and then discharged to the outside of a heat treatment apparatus 1.

Figure 2:
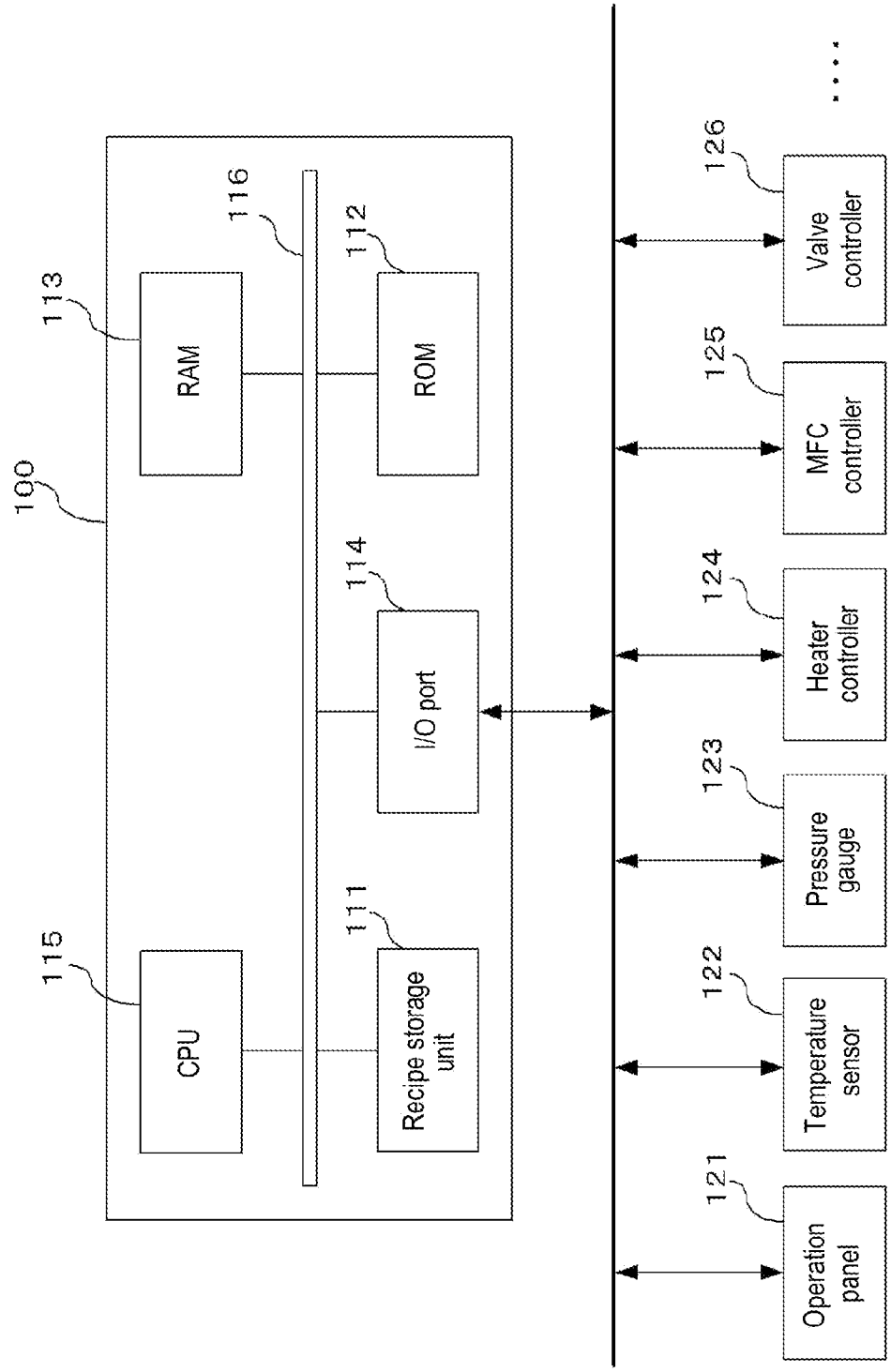
FIG. 2 depicts a controller of the apparatus shown in FIG. 1.

Furthermore, the heat treatment apparatus 1 is provided with a controller 100 controlling each of units of the apparatus 1. FIG. 2 shows a configuration of the controller 100. As shown in FIG. 2, the controller 100 is connected to an operation panel 121, a temperature sensor (or temperature sensor group) 122, a pressure gauge (or pressure gauge group) 123, a heater controller 124, a MFC (a mass flow controller) controller 125, a valve controller 126 or the like.

The operation panel 121 is provided with a display and operational buttons to deliver operative instructions from an operator to the controller 100 while indicating various information from the controller 100 on the display.

The temperature sensor (or temperature sensor group) 122 configure to measure the temperature within each of the units including the reaction tube 2, the processing gas introduction tube 13, the exhaust pipe 16 or the like to inform the controller 100 of the measured values. The pressure gauge (or pressure gauge group) 123 measures the pressure within each of the units including the reaction tube 2, the processing gas introduction tube 13, the exhaust pipe 16 or the like to inform the controller 100 of the measured values.

The heater controller 124 for individually controlling the heaters 12 configure to apply electricity to the heaters 12 to generate heat in response to instructions from the controller 100 and individually measures power consumption of the heaters 12 to inform the controller 100.

The MFC controller 125 configure to control MFCs (not shown) provided in the processing gas introduction tube 13 and the purge gas supply tube 15 so as to maintain flow rates of the gases flowing through the tubes 13 and 15, respectively, in the flow rates instructed by the controller 100 and inform the controller 100 of measurements of flow rates of the gases actually flowed.

The valve controller 126 configure to control opening degrees of the valves provided in the tubes, respectively, in values instructed by the controller 100.

The controller 100 includes a recipe storage unit 111, a ROM (Read Only Memory) 112, a RAM (Random Access Memory) 113, an I/O port (Input/Output port) 114, a CPU (Central Processing Unit) 115 and a bus 116 interconnecting aforementioned components.

The recipe storage unit 111 has a set-up purpose recipe and a plurality of recipes for processing purpose stored therein. Only the set-up purpose recipe is stored at the time of manufacturing the heat treatment apparatus 1. The set-up purpose recipe is run to create a thermal model in accordance with each of the heat treatment apparatuses. The processing purpose recipe is a recipe being particularly prepared for the heat treatment (process) which the user actually performs. The processing purpose recipe defines, e.g., temperature variations of each of the components, pressure variations within the reaction tube 2, time frames of the start and end of the supply of the processing gas or the like, from the time of loading of the semiconductor wafer 10 into the reaction tube 2 to the time of unloading of the treatment-completed semiconductor wafer 10.

The ROM 112 includes an EEPROM (Electrically Erasable Programmable Read-Only Memory), a flash memory, a hard disc or the like, and the ROM 112 is a recording medium for storing an operation program or the like for the CPU 115. The RAM 113 serves as a work area or the like for the CPU 115.

The I/O port 114 is connected to the operation panel 121, the temperature sensor (temperature sensor group) 122, the pressure gauge (pressure gauge group) 123, the heater controller 124, the MFC controller 125, the valve controller 126, and so on, and controls data or a signal to be input/output.

The CPU 115 which is a key member of the controller 100 executes the control program stored in the ROM 112 and controls the operation of the heat treatment apparatus 1 based on the recipe (processing purpose recipe) stored in the recipe storage unit 111 pursuant to the instruction from the operation panel 121. That is, the CPU 115 allows the temperature sensor (temperature sensor group) 122, the pressure gauge (pressure gauge group) 123, the MFC controller 125 and so on, to measure a temperature, a pressure, a flow rate, and so on, of each portion in the reaction tube 2, the processing gas introduction tube 13, and the exhaust pipe 16, and outputs control signals to the heater controller 124, the MFC controller 125, the valve controller 126, and so on, based on the measured data, to control each portion to conform the processing purpose recipe. The bus 116 transmits information among the components.

Next, a method of forming a laminated film by using the heat treatment apparatus 1 configured as described above will be explained. Respective components of the heat treatment apparatus 1 described below are operated under the control of the controller 100 (CPU 115). Further, the temperature and pressure inside the reaction tube 2 and the gas flow rates in each of the processes are set to conform the recipe, e.g., shown in FIG. 3, in a manner for the controller 100 (CPU 115) to control the heater controller 124 (the heater 12 for raising temperature), the MFC controller 125, the valve controller 126, and so on. Further, in this embodiment, a method of forming the laminated film by repeating a process as shown in FIG. 3, in which silicon oxynitride film (SiON) using dichlorosilane (DCS) as a silicon source, ammonia ($NH_3$) as nitride agent and nitrous oxide ($N_2O$) as an oxidizing agent is formed after a silicon oxide film (SiO) using dichlorosilane (DCS) as silicon source and nitrous oxide ($N_2O$) as oxidizing agent is formed, will be described.

Figure 3:
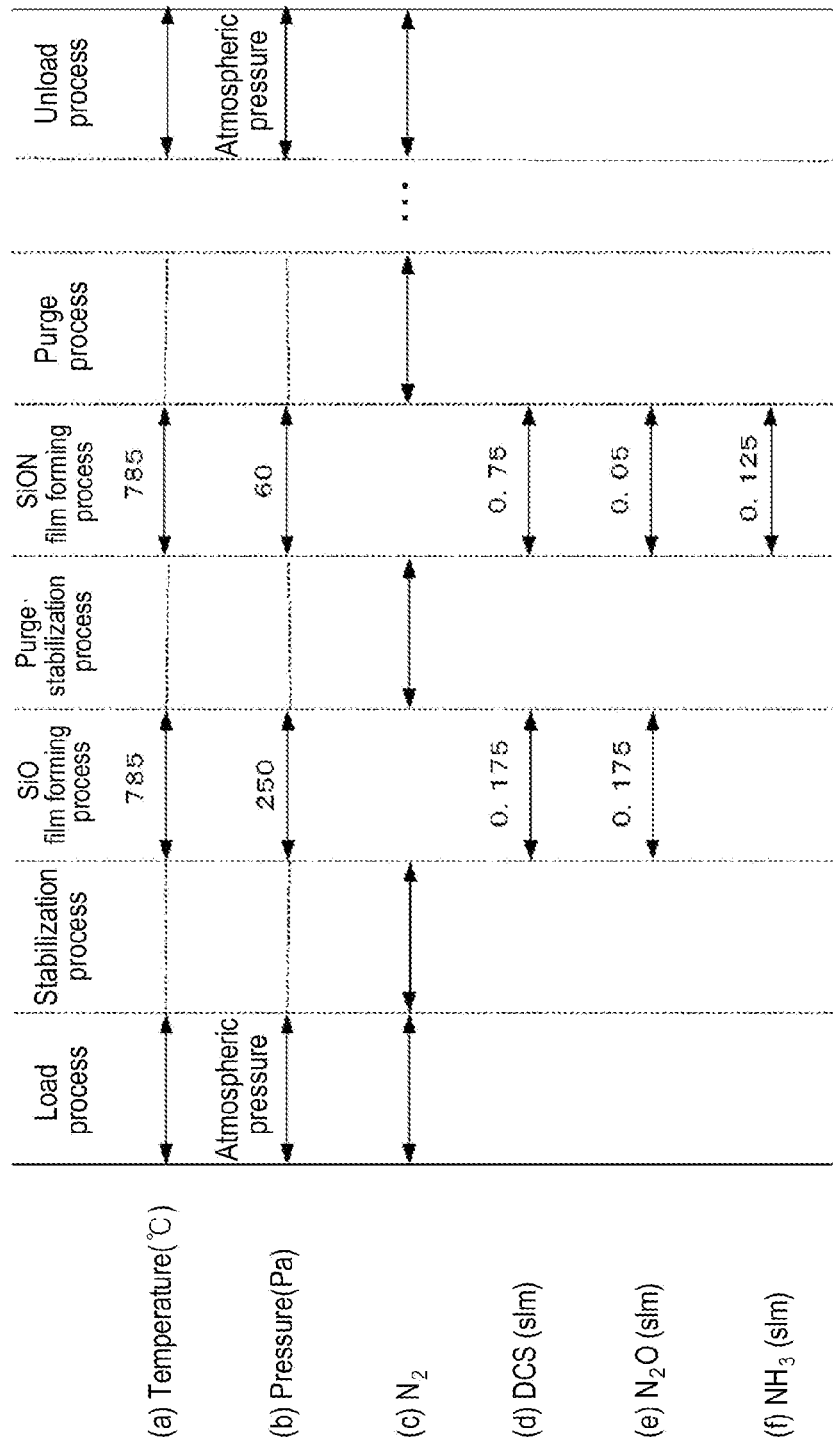
FIG. 3 shows a recipe of a method of forming a laminated film in accordance with the embodiment.

First, the interior of the reaction tube 2 is set to a predetermined temperature as indicated with (a) in FIG. 3. Further, a predetermined flow rate of nitrogen is supplied to the interior of the inner tube 3 (the reaction tube 2) from the purge gas supply tube 15 as indicated with (c) in FIG. 3. Next, the wafer boat 9 accommodating the semiconductor wafer 10 therein is mounted on the lid body 7. Next, the lid body 7 is raised by the boat elevator 8 to load the semiconductor wafer 10 (wafer boat 9) into the reaction tube 2 (loading process).

Subsequently, nitrogen is supplied through the purge gas supply tube 15 into the reaction tube 2 at a predetermined flow rate as indicated with (c) in FIG. 3 and the interior of the reaction tube 2 is set to a predetermined temperature, e.g., 785 degrees C. as indicated with (a) in FIG. 3. Furthermore, the gas is exhausted from the inside the reaction tube 2 and the inside of the reaction tube 2 is depressurized to a predetermined pressure, e.g., 250 Pa (1.88 Torr) as indicated with (b) in FIG. 3. Next, the inside of the reaction tube 2 is stabilized at the temperature and pressure described above (stabilization process).

Herein, the temperature inside the reaction tube 2 is preferably set to 600 to 1000 degrees C., and more preferably to 700 to 900 degrees C. The pressure inside the reaction tube 2 is preferably set to 1.33 Pa (0.01 Torr) to 1330 Pa (10 Torr), and more preferably to 13.3 Pa (0.1 Torr) to 665 Pa (5 Torr). By setting the temperature and pressure inside the reaction tube 2 to the range described above during the SiO film forming process, more uniform SiO film (silicon oxide film) may be obtained.

When the inside of the reaction tube 2 is stabilized at the predetermined pressure and temperature, the supply of nitrogen through the purge gas supply tube 15 is stopped. Next, film-forming gases are supplied into the reaction tube 2 through the processing gas introduction tube 13 at predetermined flow rates. For example, DCS as the silicon source is supplied at a rate of 0.175 slm as indicated with (d) in FIG. 3, while $N_2O$ as the oxidizing agent is supplied at a rate of 0.175 slm as indicated with (e) in FIG. 3. In this manner, the SiO film is formed on the surface of the semiconductor wafer 10.

When the SiO film being formed on the surface of the semiconductor wafer 10 reaches a predetermined thickness, the supply of the film-forming gases through the processing gas introduction tube 13 is stopped. Next, nitrogen is supplied through the purge gas supply tube 15 into the reaction tube 2 at a predetermined flow rate as indicated with (c) in FIG. 3, while the interior of the reaction tube 2 is set to a predetermined temperature, e.g., 785 degrees C. as indicated with (a) in FIG. 3. Furthermore, the gas inside the reaction tube 2 is exhausted and the inside of the reaction tube 2 is depressurized to a predetermined pressure, e.g., 60 Pa (0.45 Torr) as indicated with (b) in FIG. 3. The inside of the reaction tube 2 is stabilized at the temperature and pressure described above (purge and stabilization process).

Herein, the temperature inside the reaction tube 2 is preferably set to 600 to 1000 degrees C., and more preferably to 700 to 900 degrees C. The pressure inside the reaction tube 2 is preferably set to 1.33 Pa (0.01 Torr) to 1330 Pa (10 Torr), and more preferably to 13.3 Pa (0.1 Torr) to 665 Pa (5 Torr). By setting the temperature and pressure inside the reaction tube 2 to the range described above during the SiON film forming process, a SiON film (silicon oxynitride film) with a more uniform thickness may be obtained.

When the inside of the reaction tube 2 is stabilized at the predetermined pressure and temperature, the supply of nitrogen through the purge gas supply tube 15 is stopped. Next, film-forming gases are supplied into the reaction tube 2 through the processing gas introduction tube 13 at predetermined flow rates. For example, DCS as the silicon source is supplied at a rate of 0.75 slm as indicated with (d) in FIG. 3, while $NH_3$ as the nitride agent is supplied at a rate of 0.125 slm as indicated with (f) in FIG. 3. Further, $N_2O$ as oxidizing agent is supplied at a rate of 0.05 slm as indicated with (e) in FIG. 3 (SiON film forming process). In this manner, SiON film (silicon oxynitride film) is formed on the SiO film (silicon oxide film).

As described above, since $N_2O$ as the oxidizing agent is supplied in the SiON film forming process in addition to $NH_3$ as the nitride agent, oxygen is added to the film being formed, thereby mitigating a tensile stress of the film. For this reason, a crack may be prevented even if the SiO film formed in the SiO film forming process and the SiON film formed in the SiON film forming process are laminated into a highly laminated structure. Further, an etching rate of the SiON film formed in this manner may be increased and a high etching selectivity is possible when the SiON film is removed from the laminated film using, e.g., $H_3PO_4$.

Herein, the supply flow rate of $N_2O$ is preferably set to 0.01 to 10 times that of the DCS (silicon source), more preferably to 0.05 to 8 times, and most preferably to 0.07 to 5 times. Setting the supply flow rate of $N_2O$ to the aforementioned range allows only a small amount of oxygen to be added to the film being formed, thereby mitigating the tensile stress of the SiON film.

Further, the refractive index of the SiON film being formed is preferably set to 1.85 to 2 or 2.03 to 2.15, and more preferably to 1.9 to 1.95 or 2.05 to 2.1. Setting the refractive index of the SiON film to these ranges allows the SiON film being formed to have an increased etching rate and a mitigated tensile stress.

When the SiON film with a predetermined thickness is formed on the SiO film, the supply of the film-forming gases through the processing gas introduction tube 13 is stopped. Next, nitrogen is supplied through the purge gas supply tube 15 into the inner tube 3 at a predetermined flow rate as indicated with (c) in FIG. 3 so as to exhaust the gas within the reaction tube 2 (purge process).

Subsequently, a desired thickness of a laminated film is formed by repeatedly performing the stabilization process, the SiO film forming process, the purge and stabilization process, the SiON film forming process, and the purge process. When the desired laminated film is formed, nitrogen is supplied through the purge gas supply tube 15 into the inner tube 3 at a predetermined flow rate as indicated with (c) in FIG. 3 and the interior of the reaction tube 2 is set to a predetermined temperature as indicated with (a) in FIG. 3. Further, the gas within the reaction tube 2 is exhausted to return the pressure within the reaction tube 2 to atmospheric pressure. Next, the semiconductor wafer 10 (wafer boat 9) is unloaded from the reaction tube 2 by lowering the lid body 7 by the boat elevator 8 (unloading process). In this manner, the forming process for the laminated film is completed.

In order to see the effect of the method of forming the laminated film in accordance with the present disclosure, SiON films were formed on semiconductor wafers 10 arranged on top (TOP), center (CTR) and bottom (BTM) of the reaction tube 2, respectively, and measurement was conducted to the formed SiON films on items of their tensile stress (GPa) and wet etching rate (○/min) when $H_3PO_4$ is used. The films were formed under conditions of 780 degrees C. and 40 Pa (0.3 Torr) within the reaction tube 2, supply of DCS and $NH_3$ as film-forming gases at flow rates of 125 slm and 750 slm, respectively, and the supply of $N_2O$ at different flow rates of 0 (Example 1), 125 slm (Embodiment 1) and 250 slm (Embodiment 2), and 500 slm (Embodiment 3). The relationship between the supply flow rate of $N_2O$ and the tensile stress of the SiON film is shown in FIG. 4, while the relation between the supply flow rate of $N_2O$ and the etching rate when $H_3PO_4$ is used being shown in FIG. 5.

Figure 4:
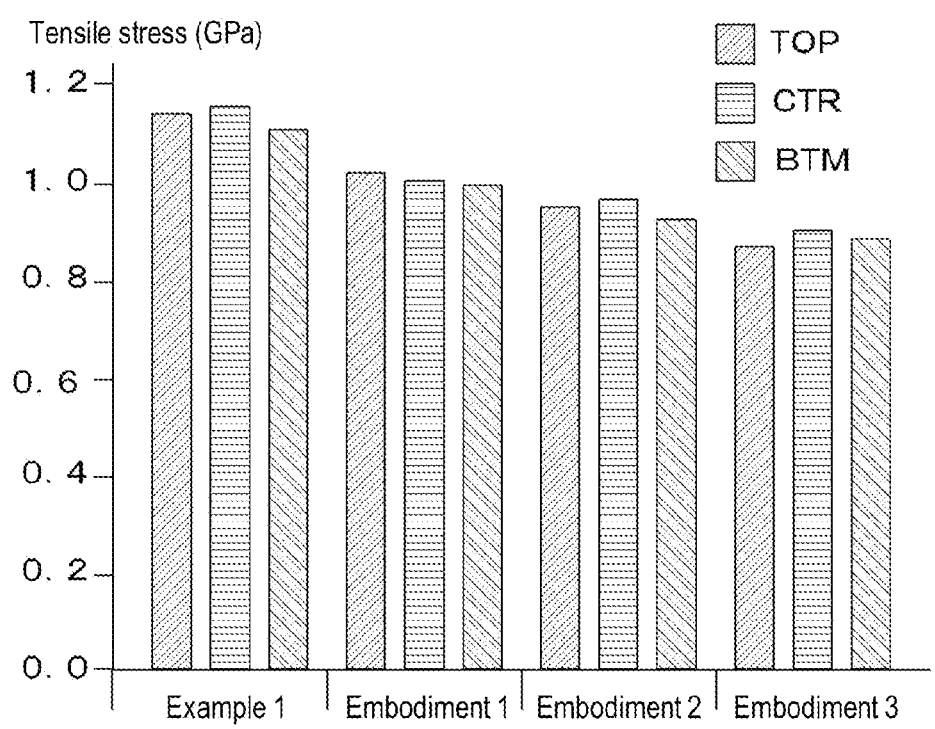
FIG. 4 is a graph showing a relation between a supply flow rate of $N_2O$ and a tensile stress of a SiON film.
Figure 5:
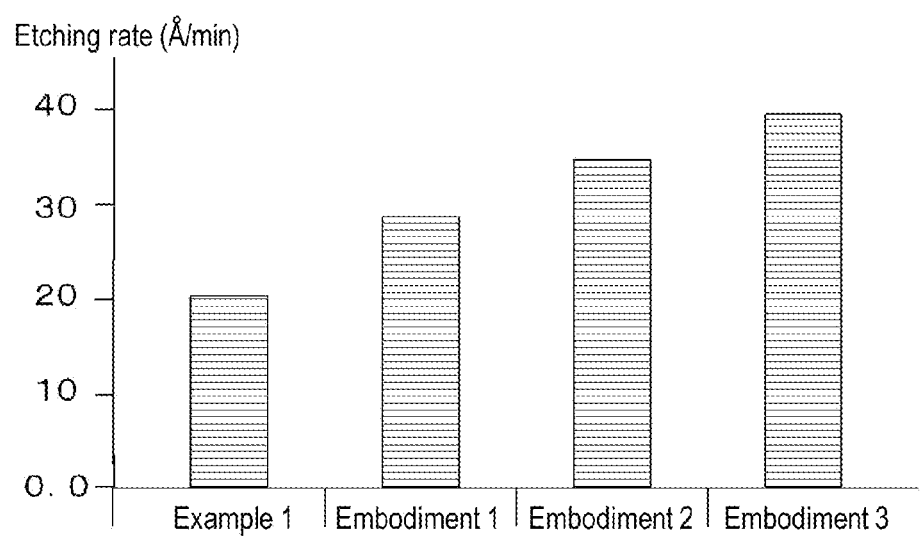
FIG. 5 is a graph showing a relation between the supply flow rate of $N_2O$ and an etching rate when $H_3PO_4$ is used.

As shown in FIG. 4, adding $N_2O$ as the oxidizing agent in the SiON film forming process in addition to $NH_3$ as the nitride agent resulted in SiON film having a mitigated tensile stress. More specific, 26% reduction of the tensile stress was confirmed in the SiON film in the embodiment 3, compared to the SiON film in Example 1. Further, as shown in FIG. 5, a gradual increase in the etching rates in $H_3PO_4$ of the SiON films was confirmed. Particularly, the SiON film in the embodiment 3 was confirmed to have a twice-increased etching rate in $H_3PO_4$ compared to the SiON film in Example 1.

As described above, according to the embodiments of the present disclosure, supplying $N_2O$ as the oxidizing agent in the SiON film forming process in addition to $NH_3$ as the nitride agent results in SiON film having a mitigated tensile stress. For this reason, a crack may be prevented even if the SiO film formed in the SiO film forming process and the SiON film formed in the SiON film forming process are formed into a highly laminated structure. Further, an etching rate of the formed SiON film may be increased and a high etching selectivity between the SiON film and the SiO film is possible when the SiON film is removed from the laminated film using, e.g., $H_3PO_4$.

Further, the present disclosure is not limited to the embodiments described above and various modifications and applications are possible. Herein below, other modifications of the present disclosure will be described.

In the embodiments described above, although the forming process of the SiO film is exemplified in which DCS as the silicon source and $N_2O$ as the oxidizing agent are used, it may be possible to form hydrogen atmosphere in the reaction tube 2 by supplying hydrogen gas ($H_2$) in addition to DCS as the silicon source and $N_2O$ as the oxidizing agent. In this case, the hydrogen atmosphere (hereinafter "$H_2$ atmosphere") within the reaction tube 2 makes it difficult for a hydrogen atom or chlorine atom to be contained in the SiO film being formed on the surface of the semiconductor wafer 10. For this reason, the etching resistance of the silicon oxide film is enhanced and a bad influence to the performance of the device may be avoided.

Herein, the flow rate of the hydrogen gas being supplied is preferably set to 0.5 to 10 times that of the DCS (silicon source) and more preferably to 0.8 to 5 times. Setting the flow rate of the supplied hydrogen gas in these ranges makes it difficult for a hydrogen atom or chlorine atom to be contained in the silicon oxide film being formed, whereby the etching resistance of the silicon oxide film is increased and the bad influence to the performance of the device may be avoided. The flow rate of the hydrogen gas being supplied is most preferably set to 1 to 2.5 times that of the DCS. Although increasing the flow rate of the hydrogen gas supplied may reduce the chlorine atom contained in the film, it may cause the degradation of the film-forming rate of the SiO film.

Further, it may be possible to form hydrogen and oxygen atmosphere (hereinafter "$H_2+O_2$ atmosphere") in the reaction tube 2 by supplying hydrogen gas and oxygen gas into the reaction tube 2 after forming the SiO film pursuant to the SiO film forming process. The $H_2+O_2$ atmosphere within the reaction tube 2 makes it difficult for a nitrogen atom or the like to be contained in the SiO film being formed on the surface of the semiconductor wafer 10. For this reason, the etching rate of the SiO film may be lowered (the etching resistance is enhanced) and when SiON film is removed from the laminated film in, e.g., $H_3PO_4$, the etching selectivity of the SiON film and the SiO film may be increased.

Herein, the flow rate of the hydrogen and oxygen gases being supplied is preferably set to 0.5 to 10 times that of the DCS (silicon source), more preferably to 0.8 to 5 times and most preferably to 1 to 2.5 times. Further, the ratio of the flow rate of the oxygen ($O_2$) being supplied versus the flow rate of the hydrogen ($H_2$) being supplied is preferably set to 1.2:1 to 3:1 and more preferably to 1.5:1 to 2:1. Setting the supply flow rates of the hydrogen and oxygen gases in these ranges makes it difficult for a nitrogen atom or the like to be contained in the SiO film being formed, whereby the etching resistance of the SiO film is increased and the bad influence to the performance of the device may be avoided.

As described above, it is preferable to form the SiO film using one of the following four methods in the SiO film forming process: (1) a method where DCS and $N_2O$ are used to form the SiO film as in the embodiments, (2) a method where the SiO film is formed under the atmosphere of DCS, $N_2O$ and $H_2$, (3) a method where the $H_2+O_2$ atmosphere is formed after the SiO film is formed by the method (1) and (4) a method where the $H_2+O_2$ atmosphere is formed after the SiO film is formed by the method (2).

When the SiO film forming process and the SiON film forming process are repeated plural times to form the laminated film, the SiO film forming processes being repeated are not limited to using only one method from the four methods as described above and plural kinds of methods may be employed. For example, during the repetition of the SiO film forming process, the SiO film may be formed using the method (1) for the first plural times and then it may be formed using the method (2). Further, the laminated film may be formed using the method (1) to the method (4), changing the method in this order, with one method used plural times to the other, i.e., the method (1) is selected to form the first plural SiO films, then the method (2) is used to form the next plural SiO films, then the method (3) is used to form the next plural SiO films and then the method (4) is finally used to form the last plural SiO films.

In the embodiments described above, although an example where DCS as the silicon source, ammonia as the nitride agent and $N_2O$ as the oxidizing agent are used is described for understanding of the present disclosure, any material may be possible as long as it can form the SiON film and the SiO film ($SiO_2$ film) constituting the laminated film. For example, tetrachlorosilane, trichlorosilane and hexachlorosilane (HCD) may be used as the silicon source. Further, nitrogen (N2) may be used as the nitride agent. Further, nitric oxide (NO), nitrogen dioxide ($NO_2$) and ozone ($O_3$) may be used as the oxidizing agent.

In the embodiments described above, although a batch type vertical heat treatment apparatus having double tube configuration is exemplified as a forming apparatus of the laminated film for the explanation of the present disclosure, the present disclosure may be applicable to, e.g., a batch type heat treatment apparatus having a single tube configuration.

The controller 100 in accordance with the present invention may be implemented using a normal computer system instead of using a dedicated system. for example, it is possible to configure the controller 100 instructing the aforementioned processes by installing a program for executing the above described processes in a general-purpose computer from a recording medium (flexible disk, CD-ROM (compact disc read only memory), etc.) storing therein the program.

Any kinds of means for providing these programs may be used. For example, providing via a communication line, a communication network, and the communication system may be possible in addition to the providing via the predetermined recording medium as described above. In this case, for example, the program posted to a bulletin board of the communication network (BBS; bulletin board system) can be provided in a form of being superimposed on the carrier wave through a network. Further, it is possible to perform the above described processes by starting and running the program provided in this way similarly to other application programs under the control of OS (Operating System).

The present disclosure provides a useful method of forming the laminated film and a forming apparatus thereof.

According to present disclosure, it is possible to provide a method of forming a laminated film and a forming apparatus thereof which can suppress the occurrence of cracks.

While certain embodiments have been described, these embodiments have been presented by way of example only and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a laminated film comprising:
    forming a silicon oxide film on a plurality of target objects loaded in a reaction chamber by supplying a hydrogen gas into the reaction chamber forming a hydrogen atmosphere and supplying a silicon source, an oxidizing agent, and a hydrogen gas into the reaction chamber after the hydrogen atmosphere is formed within the reaction chamber; and
    forming a silicon oxynitride film on the plurality of target objects by supplying a silicon source, an oxidizing agent and a nitride agent to the reaction chamber,
    wherein forming the silicon oxide film and forming the silicon oxynitride film are repeatedly performed for a predetermined number of times on the plurality of target objects to form the laminated film including the silicon oxynitride film and the silicon oxide film, and
    wherein forming the silicon oxide film by supplying the silicon source, the oxidizing agent, and the hydrogen gas is consecutively performed plural times to form the laminated film of the silicon oxide film and the silicon oxynitride film on the plurality of target objects.

2. The method of claim 1, wherein forming the silicon oxide film includes supplying the hydrogen gas and an oxygen gas into the reaction chamber to form a hydrogen and oxygen atmosphere within the reaction chamber after the silicon oxide film is formed by supplying the silicon source, the oxidizing agent, and the hydrogen gas into the reaction chamber.

3. The method of claim 2, wherein forming the silicon oxide film by supplying the silicon source, the oxidizing agent, and the hydrogen gas and then supplying the hydrogen gas and an oxygen gas is consecutively performed plural times to form the laminated film of the silicon oxide film and the silicon oxynitride film on the plurality of target objects.

4. The method of claim 1, wherein, in forming the silicon oxynitride film, a flow rate of the oxidizing agent being supplied is 0.01 to 10 times that of the silicon source.

5. The method of claim 1, wherein, in forming the silicon oxynitride film, nitric oxide is used as the oxidizing agent.

6. The method of claim 1, wherein, in forming the silicon oxynitride film and the silicon oxynitride film, a temperature within the reaction chamber is set to 600 to 1000 degrees C.

7. A method of forming a laminated film comprising:
    forming a silicon oxide film on a plurality of target objects loaded in a reaction chamber by simultaneously supplying a silicon source and an oxidizing agent into the reaction chamber; and
    forming a silicon oxynitride film on the plurality of target objects by supplying a silicon source, an oxidizing agent and a nitride agent to the reaction chamber,
    wherein forming the silicon oxide film and forming the silicon oxynitride film are repeatedly performed for a predetermined number of times on the plurality of target objects to form the laminated film including the silicon oxynitride film and the silicon oxide film, and
    wherein forming the silicon oxide film by supplying the silicon source, the oxidizing agent, and the hydrogen gas is consecutively performed plural times to form the laminated film of the silicon oxide film and the silicon oxynitride film on the plurality of target objects.

8. The method of claim 7, wherein forming the silicon oxide film includes supplying a hydrogen gas and an oxygen gas into the reaction chamber to form a hydrogen and oxygen atmosphere within the reaction chamber after the silicon oxide film is formed by supplying the silicon source and the oxidizing agent.

9. The method of claim 8, wherein forming the silicon oxide film by supplying the hydrogen gas and an oxygen gas and then supplying the hydrogen gas and an oxygen gas is consecutively performed plural times to form the laminated film of the silicon oxide film and the silicon oxynitride film on the plurality of target objects.

10. The method of claim 7, wherein forming the silicon oxide film by supplying the silicon source and the oxidizing agent is consecutively performed plural times to form the laminated film of the silicon oxide film and the silicon oxynitride film on the plurality of target objects.

11. A method of forming a laminated film comprising:
forming a silicon oxide film on a plurality of target objects loaded in a reaction chamber by simultaneously supplying a silicon source and an oxidizing agent into the reaction chamber; and
forming a silicon oxynitride film on the plurality of target objects by supplying a silicon source, an oxidizing agent and a nitride agent to the reaction chamber,
wherein forming the silicon oxide film and forming the silicon oxynitride film are repeatedly performed for a predetermined number of times on the plurality of target objects to form the laminated film including the silicon oxynitride film and the silicon oxide film,
wherein forming the silicon oxide film includes supplying a hydrogen gas and an oxygen gas into the reaction chamber to form a hydrogen and oxygen atmosphere within the reaction chamber after the silicon oxide film is formed by supplying the silicon source and the oxidizing agent, and
wherein forming the silicon oxide film by supplying the hydrogen gas and an oxygen gas and then supplying the hydrogen gas and an oxygen gas is consecutively performed plural times to form the laminated film of the silicon oxide film and the silicon oxynitride film on the plurality of target objects.

* * * * *